United States Patent [19]

Reinke

[11] Patent Number: 4,675,594

[45] Date of Patent: Jun. 23, 1987

[54] VOLTAGE-TO-CURRENT CONVERTER

[75] Inventor: James D. Reinke, New Hope, Minn.

[73] Assignee: Honeywell Inc., Minneapolis, Minn.

[21] Appl. No.: 892,617

[22] Filed: Jul. 31, 1986

[51] Int. Cl.⁴ .............................................. G05F 3/16
[52] U.S. Cl. ...................................... 323/317; 363/73; 307/297
[58] Field of Search ........................ 323/315, 316, 317; 363/73; 307/297

[56] References Cited

U.S. PATENT DOCUMENTS

| Re. 29,700 | 7/1978 | Van de Plassche | 323/317 |
|---|---|---|---|
| 4,004,247 | 1/1977 | Van de Plassche | 323/315 |
| 4,216,435 | 8/1980 | Ahmed | 330/257 |
| 4,338,527 | 7/1982 | Nagano | 307/296 R |
| 4,442,400 | 4/1984 | Nagano | 323/315 |
| 4,607,233 | 8/1986 | Van Tuijl | 330/255 |

OTHER PUBLICATIONS

"Bipolar and MOS Analog Integrated Circuit Design," A. B. Grebene, A Wiley-Interscience Publication, 1984, pp. 376-380.

"Integrated Circuit Precision Instrumentation Amplifier," Data-Acquisition Databook 1984, Analog Devices, Inc., 1984, vol. 1, pp. 5-21 through 5-26.

Primary Examiner—Patrick R. Salce
Assistant Examiner—Jeffrey Sterrett
Attorney, Agent, or Firm—William T. Udseth

[57]  ABSTRACT

A voltage-to-current converter is provided based on a pair of current sources providing current to two other pairs of current sources, one pair in the input stage and one pair in the output stage. Careful matching of current source pairs provides a large common mode rejection ratio and a large power supply variation rejection ratio.

22 Claims, 7 Drawing Figures

VOLTAGE-TO-CURRENT CONVERTER

BACKGROUND OF THE INVENTION

The present invention relates to voltage-to-current signal converters, and more particularly, converters having differential inputs to receive voltage signals for conversion to current flows at the output in a direction depending on input differential signal polarity.

A number of uses have been found for circuits which can convert a voltage signal supplied at the circuit input to a corresponding current at the circuit output. Such uses include, for instance, the testing of other electronic circuits or components at various current levels, and for providing controllable currents to certain kinds of circuits which are to be supplied such currents during operation of the system in which they are included.

A number of different circuit configurations are known for these purposes. In many instances, the use of a differential voltage input is quite desirable because precise conversions can be made based on the voltage difference at the inputs while the voltage portions common to the signal of each input are ignored. In many instances, the differential voltage between two voltage signals may be much less than the full value of either of the signals. In these circumstances, extremely high common mode rejection ratios and power supply variation rejection ratios are necessary. Further, a high input impedance is required to avoid placing any kind of loading on such signal sources.

Many of the known circuits for this kind of conversion are based primarily on operational amplifiers and either cannot, or cannot without great difficulty and expense, satisfy such stringent performance characteristics. Furthermore, many of these circuits, to be able to meet such performance requirements, would need to rely on measures which are not easily compatible with forming the circuits as monolithic integrated circuits.

SUMMARY OF THE INVENTION

This invention provides a converter based on a pair of current sources providing current to two other pairs of current sources, one pair in the input stage and one pair in the output stage. The latter pair may obtain current through current pass devices controlled in feedback loops with control of one of these loops provided by the input stage. An input differential voltage supplied to a pair of voltage setting means in the input stage causes a current imbalance in the input stage which is accurately reflected in the output stage such that this reflection current is available to drive a wide range of electrical loads. Careful matching of current source pairs greatly reduces any differential signals occurring in either of the input or output stages to provide a large common mode rejection ratio and a large power supply variation rejection ratio.

DESCRIPTION OF THE PREFERRED EMBODIMENT

Figure 1:
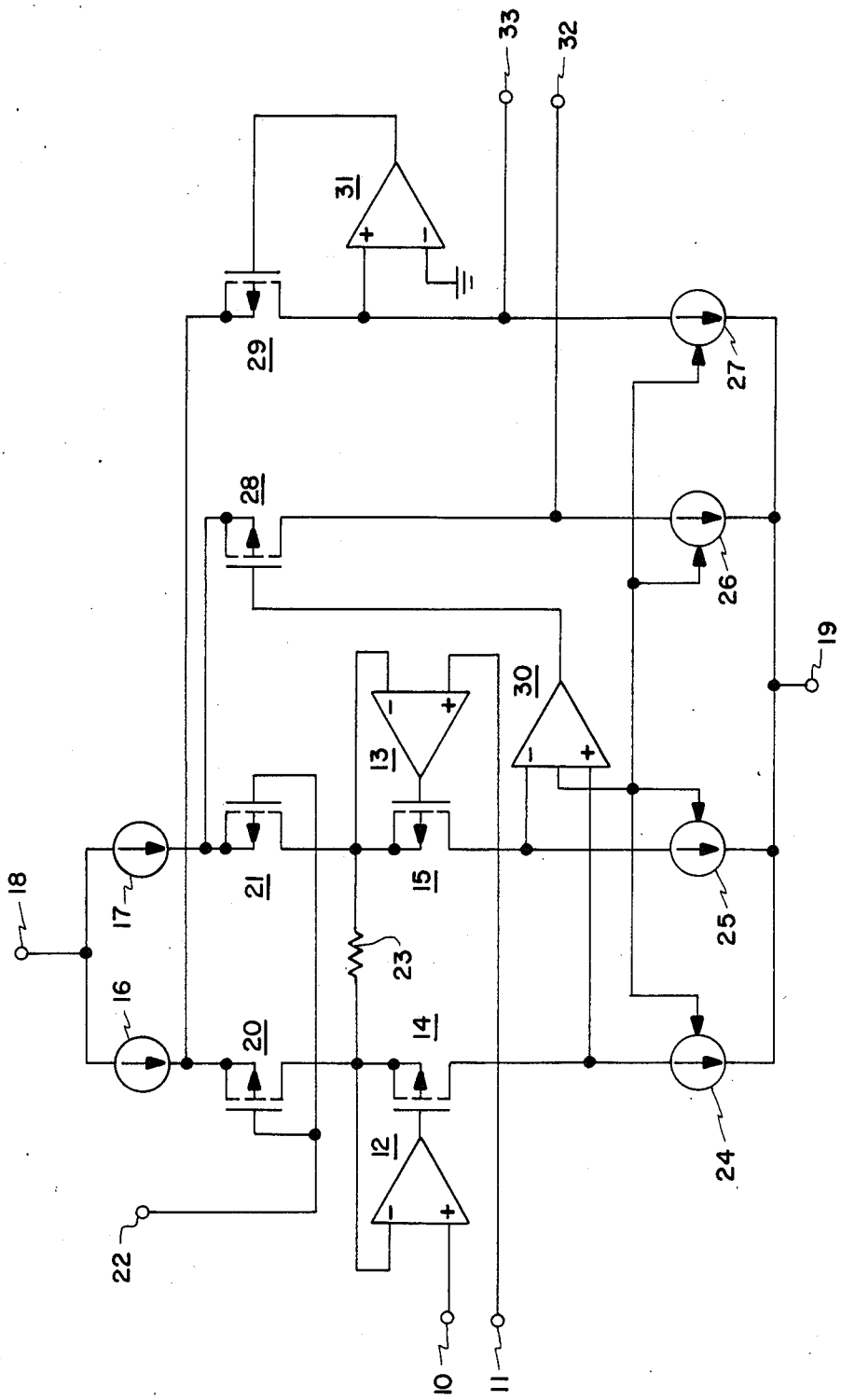
FIG. 1 shows a condensed and simplified schematic diagram of the circuit of the present invention.

Shown in FIG. 1 is the schematic diagram of a differential input voltage to bidirectional output current converter. This schematic is in a somewhat simplified form in that certain circuit components are condensed into functional blocks, or are omitted altogether, to thereby provide easier understanding.

The circuit shown in FIG. 1 can be fabricated in a monolithic integrated circuit chips through use of any suitable fabrication process for fabricating chips which contain enhancement mode, complementary, insulated gate, field-effect transistors (IGFETs), npn bipolar transistors, stable resistors which are typically thin film resistors provided on such chip, and capacitors. Several such fabrication processes are known.

For instance, a p-type conductivity substrate can be used in which each enhancement mode, n-channel insulated gate field-effect transistor, e.g. silicon gate, metal-oxide-semiconductor field-effect transistor (MOSFET), can be formed directly. Each enhancement mode, p-channel silicon gate MOSFET can be formed in an n-type conductivity region, often called a well or a tub, which is formed in this p-type conductivity substrate.

In such an arrangement, each substrate connection for each n-channel MOSFET is made to the p-type conductivity substrate and this substrate is connected to the most negative supply voltage in the circuit, here −5.0 volts. The p-channel MOSFET substrate connections, in many instances, are each made to the n-type conductivity well in which it is formed, which wells in turn are each electrically connected to the most positive supply voltage in the circuit, here 15.0 volts. In some instances however, the substrate connection to the p-channel MOSFETs are directly made to the source of the MOSFET and are explicitly shown so in the schematic diagrams disclosed in this application. In any situations where a p-channel MOSFET substrate connection is not shown connected, that substrate can be assumed to be connected to the n-well in which such transistor is formed.

Typical fabrication processes currently permit the channel length of the n-channel and p-channel MOSFETs to be as short as being in the range from 3 to 1 $\mu$m. However, longer channel lengths will often be chosen in analog circuits such as the present to permit use of a higher voltage between the drain and source without encountering a device breakdown. The channel widths for these transistors can be readily selected to form desired channel width-to-length ratios to provide suitable device characteristics.

Also, steps taken in such fabrication processes to set the value of the threshold voltage for both the n-channel and p-channel MOSFETs results in both kinds of transistors having a zero source-substrate difference threshold voltage of approximately the same magnitude, but of opposite signs as the natures of the two kinds of transistors require. The zero source-substrate difference threshold voltage value for the n-channel MOSFET is approximately 0.8 volts, and for the p-channel transistor threshold voltage is approximately −0.8 volts. Variations of the threshold voltage due to fabrication process variations lead to similar changes in value and a common direction for both n-channel and p-channel MOSFETs. However, changes in threshold voltage due to temperature effect the magnitude of the threshold voltage of each kind of transistor only.

The npn bipolar transistors can be formed in n-type conductivity wells each using the well as its collector. Transistor base widths are typically 1 to 2 μm. Emitter areas for these transistors can be chosen essentially as desired above a minimum of 64 μm² to provide satisfactory device characteristics.

The stable resistors can be thin film resistors deposited on an insulating material surface of the monolithic integrated circuit chip and may typically be formed of $CR_xSi_y$ (and sometimes with $N_z$ appended in certain applications), i.e. chrome-silicon resistors (sometimes nitrogen doped), with the proportions of the constituent chemicals being varied from application to application to achieve certain values of resistivity, temperature and voltage coefficients, and the like. The temperature coefficients of these resistors will typically be on the order of ±100 ppm while the voltage coefficient will typically be on the order of ±1 ppm or less. The resistors shown on the schematics in this application are all formed in this manner to have very similar conditions leading to the resistors being well matched. As a result, ratios of resistors values will change over temperature less than 1 ppm. These resistors typically have a resistivity of $2.5 \times 10^3$ Ω-cm and are typically 0.05 μm thick.

The capacitors are formed using silicon dioxide as a dielectric with a thickness of 0.075 μm. The capacitor plates are each formed of doped polycrystalline silicon or "polysilicon." The capacitance achieved is typically 0.3 pf/mil².

Input voltage signals to the circuit of FIG. 1 are applied to input signal terminal means or regions, 10 and 11. These terminals are connected to the non-inverting terminals of two identical operational amplifiers, 12 and 13, respectively, which control two transistors, 14 and 15, in feedback loops used around operational amplifiers 12 and 13. The output terminal, or region, of operational amplifier 12 is connected to the gate of p-channel MOSFET 14, and the output region of operational amplifier 13 is connected to the gate of p-channel MOSFET 15. The source of transistor 14 is connected to the inverting input terminal, or region, of operational amplifier 12, and the source of transistor 15 is connected to the inverting input of operational amplifier 13. Transistors 14 and 15 each have width-to-length ratios of 250/10.

Operational amplifier 12 and transistor 14, on the one hand, and operational amplifier 13 and transistor 15, on the other hand, comprise voltage setting means for the input stage of the circuit. This input circuit stage further comprises those components more or less lying along a vertical line through the source and drain regions of transistors 14 and 15 as shown in FIG. 1. More about operational amplifiers 12 and 13 will be described below.

The other components in the first stage of the circuit shown in FIG. 1 include two current sources, 16 and 17, shown with current input side terminal means, or terminating regions, thereof each electrically connected to a terminal means adapted for connection to the most positive source of voltage to be used with the circuit, this terminal marked 18. The terminal means or region in the circuit to be connected to the most negative supply of voltage for the circuit is designated 19.

The current output or supply terminals or regions of current sources 16 and 17 are connected to the sources of p-channel MOSFETs, 20 and 21. Transistors 20 and 21 each have width-to-length ratios of 250/10. Transistors 20 and 21 pass current supplied by current sources 16 and 17 from their source to drain regions through their channel regions, respectively. Transistors 20 and 21 provide a high impedance at their respective drains isolating the earlier described voltage setting means from current sources 16 and 17, and from other components connected to these current sources from the second stage of the circuit as will be described below.

The gates of transistors 20 and 21 are electrically connected together and to a terminal means or region, 22, adapted for connection to a source of bias voltage having a value of about 4.0 volts less than the voltage on terminal 18, here 15.0 volts. The drain of transistor 20 is connected to the source of transistor 14, and the drain of transistor 21 is connected to the source of transistor 15.

Also connected to the sources of transistors 14 and 15 is a current setting resistor, 23. One end of resistor 23 is connected to the source of transistor 14 and the other end of resistor 23 is connected to the source of transistor 15.

Finally, two further current sources are part of the input stage, current sources designated 24 and 25. The current input side terminal means or region of current source 24 is connected to the drain of transistor 14, and the current input side terminal of transistor 25 is connected to the drain of transistor 15. The current output side terminal of each of current sources 24 and 25 is connected to terminal means 19. Current sources 24 and 25 are voltage controlled current sources with the voltage control signal supplied at control input regions each marked by an arrow at the sides of the symbols for these current sources in FIG. 1. The current selected for current sources 24 and 25 are generally approximately half that provided by current sources 16 and 17.

Similarily controlled are two current sources in the second stage of the circuit, 26 and 27. The terminals of sources 26 and 27 from which current is supplied are each connected to terminal means 19. The selection of the current to be supplied is again controlled through control input regions shown at the sides of sources 26 and 27 and marked with arrows thereat. Current sources 26 and 27 again each supply about half the current supplied by each of sources 16 and 17.

Two p-channel MOSFET transistors, 28 and 29, controlled in feedback loops, pass current supplied by current sources 16 and 17 from the source to the drain of each through their channel region to current sources 26 and 27. Transistors 28 and 29 each have width-to-length ratios of 250/10. The source region of transistor 28 is connected to the current supply region of current source 17, and the source region of transistor 29 is connected to the current supply region of current source 16. The drain of transistor 28 is connected to the current input region of current source 26, and the drain of transistor 29 is connected to the current input region of current source 27.

The gate of transistor 28 is connected to the output region of an operational amplifier, 30. The inverting input terminal or region of operational amplifier 30 is connected to the drain of transistor 15. The non-inverting input of operational amplifier 30 is connected to the drain of transistor 14. Operational amplifier 30 has an additional output region, the common mode output region, which provides a signal which is representative of the average of the voltages applied to the inverting and non-inverting input regions, i.e. the common mode voltage. This signal is applied to the control input regions of current sources 24, 25, 26 and 27 to set the currents therethrough.

The gate of transistor 29 is connected to the output region of operational output region, 31. The non-inverting input terminal or region of operational amplifier 31 is connected to the drain of transistor 29. The inverting input is connected to a reference voltage of a value intermediate the value of the voltages chosen to be applied to terminal means 18 and 19, here shown to be chosen as ground.

Operational amplifiers 12, 13, 30 and 31 all have more or less the characteristics typical of operational amplifiers, that is, a relatively high circuit input impedance at the inverting and non-inverting inputs. General purpose operational amplifiers will also usually have a relatively low circuit impedance at the primary operational amplifier output where signals depending on the differential input voltage occur. The operational amplifiers used here, however, need not have a very low output impedance since in each instance they have relatively high impedance loads on the outputs thereof.

The signals at the primary output region of these operational amplifiers have a very large gain over those corresponding signals appearing at the inverting and non-inverting inputs of the operational amplifiers, the gain being positive at the primary output with respect to the non-inverting input but negative with respect to those appearing at the inverting input.

In operating the system, current sources 16 and 17 provide currents which are very closely matched to achieve near equality over the operating conditions of the system. A portion of the current from current source 16 is shunted away from transistor 20 by operational amplifier 31 and transistor 29 in the second stage. As earlier indicated, the reference voltage to which the inverting input of operational amplifier 31 is connected is shown as ground. Operational amplifier 31, through the feedback loop involving transistor 29, will operate transistor 29 so as to provide enough current to prevent current source 27, through its sinking of current, from causing the non-inverting input of operational amplifier 31 to change from the reference voltage occurring on the inverting input. That is, operational amplifier 31 will cause transistor 29 to pass sufficient current to satisfy the demand of current source 27 to the extent it is unsatisfied by current supplied through the operating load selected to be connected between output regions 32 and 33.

The bias voltage on terminal means 22 sets the gate voltage for transistor 20. The remaining current from current source 16, current not passing through transistor 29, will be supplied through transistor 20 with the gate-to-source voltage of transistor 20 adjusting sufficiently to cause transistor 20 to pass such current. The use of transistor 20 provides the result that voltage changes occurring on the drain of transistor 20 will not affect the voltage drop across current source 16 nor the voltage applied to the source of transistor 29.

The current from the drain of transistor 20 will be carried through transistor 14. If there is a voltage difference established across resistor 23 by the application of voltage signals to system input regions 10 and 11, as will be described below, with the lower voltage occurring at the source of transistor 15, then some part of the current through transistor 20 will also pass through resistor 23. Alternatively, should the voltage at the source of transistor 15 exceed that of the source of transistor 14, current will be added through resistor 23 to the current supplied through transistor 20 to be carried by transistor 14.

Since the signal voltages applied to input regions 10 and 11, the difference between them to be converted to a signal current at output regions 32 and 33, are the voltages experienced at the non-inverting inputs of operational amplifiers 12 and 13, this difference between them is that will appear across resistor 23. This follows because operational amplifiers 12 and 13 will control transistors 14 and 15 at the gates thereof so that the voltage at the sources of those transistors, which are also the voltages appearing at the inverting inputs of these amplifiers, will not differ from the voltages on the non-inverting inputs. This must be so because the high gain of operational amplifiers 12 and 13 means no significant voltage difference can exist between these inputs.

In effect, the feedback loop involving operational amplifier 12 and transistor 14, and the feedback loop involving operational amplifier 13 and transistor 15, are each voltage follower arrangements requiring that the voltages on the sources of these transistors follow the voltages at their associated system input regions 10 and 11. As indicated above, the use of transistor 20 with a fixed gate bias, and the similar use of transistor 21, results in no effect on current sources 16 or 17 or the drains of transistors 28 and 29 due to any changes in voltage values which may occur on the sources of transistors 14 and 15 in response to changes in input signal voltages applied to input regions 10 and 11.

Current flowing from the drain of transistor 14 is then taken up by current source 24. Since current source 24 and current source 27 are each set to take approximately half of the current supplied by current source 16, the currents in the two circuit paths containing them will be (i) nearly equal to one another, and (ii) will equal that current supplied by current source 16 in the absence of any input differential voltage leading to a voltage difference across resistor 23. However, with the application of unequal input voltages to system input regions 10 and 11 there will be current through resistor 23 which would leave the circuit paths containing current sources 24 and 27 unbalanced with respect to one another and with respect to the current supplied by current source 16 in the absence of some arrangement to balance these currents in the face of such an input differential voltage.

Consider then the current supplied by current source 17 which, as explained above, will in part, be shunted away from transistor 21 by transistor 28 under the control of operational amplifier 30 and passed to current source 27. That portion which is not shunted away passes through transistor 21 which again will have its gate-to-source voltage adjusted sufficiently by circuit conditions to pass such current. That current is then passed by transistor 15 but increased or decreased, depending on the polarity of the input differential voltage, by any current flowing in resistor 23.

Thus, if input 10 has a greater voltage on it than input 11, there will be a greater voltage at the source of transistor 14 than at the source of transistor 15. In these circumstances, a portion will be removed from the current which flows out of the drain of transistor 20 and added to that which flows into the source of transistor 15.

Such a current imbalance between that which is flowing in transistor 14 and transistor 15, if allowed to fully occur, would lead to a substantial voltage drop difference across current sources 24 and 25 because of the resulting mismatch between currents being supplied to current sources 24 and 25 and those current values being sinked into these sources. Since, in the present example, more current would be supplied to source 25 than to source 24 there would be a larger voltage drop across source 25. This would cause operational amplifier 30 to swing to a lower voltage at its output region, the region controlling the gate of transistor 28. Such an effect forces transistor 28 to shunt therethrough a larger portion of the current being supplied by current source 17 thereby reducing the current being supplied through transistors 21 and 15 to current source 25.

However, the current being shunted by transistor 28 in this situation will be more than that which will be drawn by current source 26 and, therefore, the additional current will be forced through output region 32, the electrical load connected between output regions 32 and 33, and back into output region 33. This additional current being supplied to current source 27 will cause an increased voltage drop thereacross which will be sensed by operational amplifier 31. As a result, the inverting input of operational amplifier 31 will experience an increase in voltage forcing the output of operational amplifier 31 to a higher voltage level thereby reducing the voltage at the gate of transistor 29 and so the current therethrough.

The result is that the imbalance in currents through transistors 14 and 15, which otherwise would occur because of an application of a differential input voltage to input regions 10 and 11, is nullified by (i) a decrease in current through transistor 21 due to the increased shunting action of transistor 28 because of the reaction in its feedback loop, and (ii) an increase in current through transistor 20 because of the reduced shunting action of transistor 29 as a result of the reaction of its feedback loop. These actions of transistors 28 and 29 also lead to an increase in current through the load connected to output regions 32 and 33.

Thus, if the currents drawn by current sources 24 and 25 are very well matched, if the currents drawn by current sources 26 and 27 are very well matched, and if the gains around the feedback loops involving transistors 28 and 29 are sufficiently high so there is a very small error voltage required to drive the operational amplifier in each of these loops, the additional current through the load at the output regions 32 and 33 will quite precisely match the current flowing through resistor 23. Since the current through resistor 23 is set by the difference in voltages which are applied to inputs regions 10 and 11, the current through the electrical load connected to output regions 32 and 33 will accurately reflect the differential input voltage applied to input regions 10 and 11, these being related to one another by a substantially constant gain factor.

This can be seen by summing the currents at each of the circuit nodes to which the current sources 16 and 17 immediately supply current. For the node below the current supply region of current source 16 in FIG. 1 the following equation applies:

$$I_{16} = I_{24} + i_{23} + I_{27} - i_L$$

The equation at the node below the current supply region of current source 17 is as follows:

$$I_{17} = I_{25} - i_{23} + I_{26} + i_L$$

The subscripts on the current components indicate which circuit component these current components are flowing through. The convention of using a lower case i to indicate signal current and an upper case I to indicate fixed currents is also followed. Substracting the first equation from the second equation yields the following:

$$i_L = i_{23} + \frac{I_2 - I_1}{2} + \frac{I_4 - I_3}{2} + \frac{I_6 - I_5}{2}$$

Or $$i_L = i_{23} + i_{error}$$

Here, the differences in currents from intended matched current sources are taken to be an error signal and therefore written with a lower case i as $i_{error}$. If the resistance value of resistor 23 is designated as R, and the voltage applied to input region 10 is designated as $V_{10}$ and similarly $V_{11}$ for input region 11, the latter equation can be rewritten to show the voltage to current conversion as well as the error:

$$i_L = \frac{V_{10} - V_{11}}{R} + i_{error}$$

Thus, any difference between the load current and the current established in resistor 23 by voltages applied in input regions 10 and 11, representing an error, is due to mismatches in pairs of current sources in the circuit of FIG. 1. Careful matching of the current supplied by each member in a pair of current sources to the other and maintaining this match over temperature or other variations, coupled with using current sources of very high impedance so that changing circuit conditions do not appreciably affect the current supplied, will yield a very small error in the circuit performance. Such current sources will lead to very high values for the circuit common mode rejection ratio and the power supply rejection ratio since the error term will be so small. Such current sources will also mean that the load current will be very nearly linearly related to the input voltage differential for the voltages applied at input regions 10 and 11.

If, however, extreme accuracy is not required in the use to which the circuit of FIG. 1 is put, then certain components can be eliminated or simplified. For instance, transistors 20 and 21 could each be replaced by a short circuit, or direct interconnection, between its source region connection and a drain region connection. This leads to current source 16 being directly connected to the source of transistor 14 and to current source 17 being directly interconnected to the source of transistor 15. Such connections would leave current sources 16 and 17 and transistors 28 and 29 subject to substantial voltage variations appearing thereacross in response to the application of voltages to inputs regions 10 and 11 which would increase the error in the circuit performance.

Similarly, amplifiers 12 and 13 could be eliminated with instead the gate region of transistor 14 connected directly to the input region 10 and the gate region of transistor 15 connected directly to the input region 11. This would result in some errors occurring in the voltage established across resistor 23 because of mismatches between transistors 14 and 15. Of course, in static situations where the input voltages are unchanging, transistors 28 and 29 could be replaced with resistors of proper value coupled with eliminating their operational amplifiers, or replaced with other circuit arrangements which lead to effective impedances of values chosen to provide the proper current flows and voltage conditions for the circuit second stage.

Figure 7:
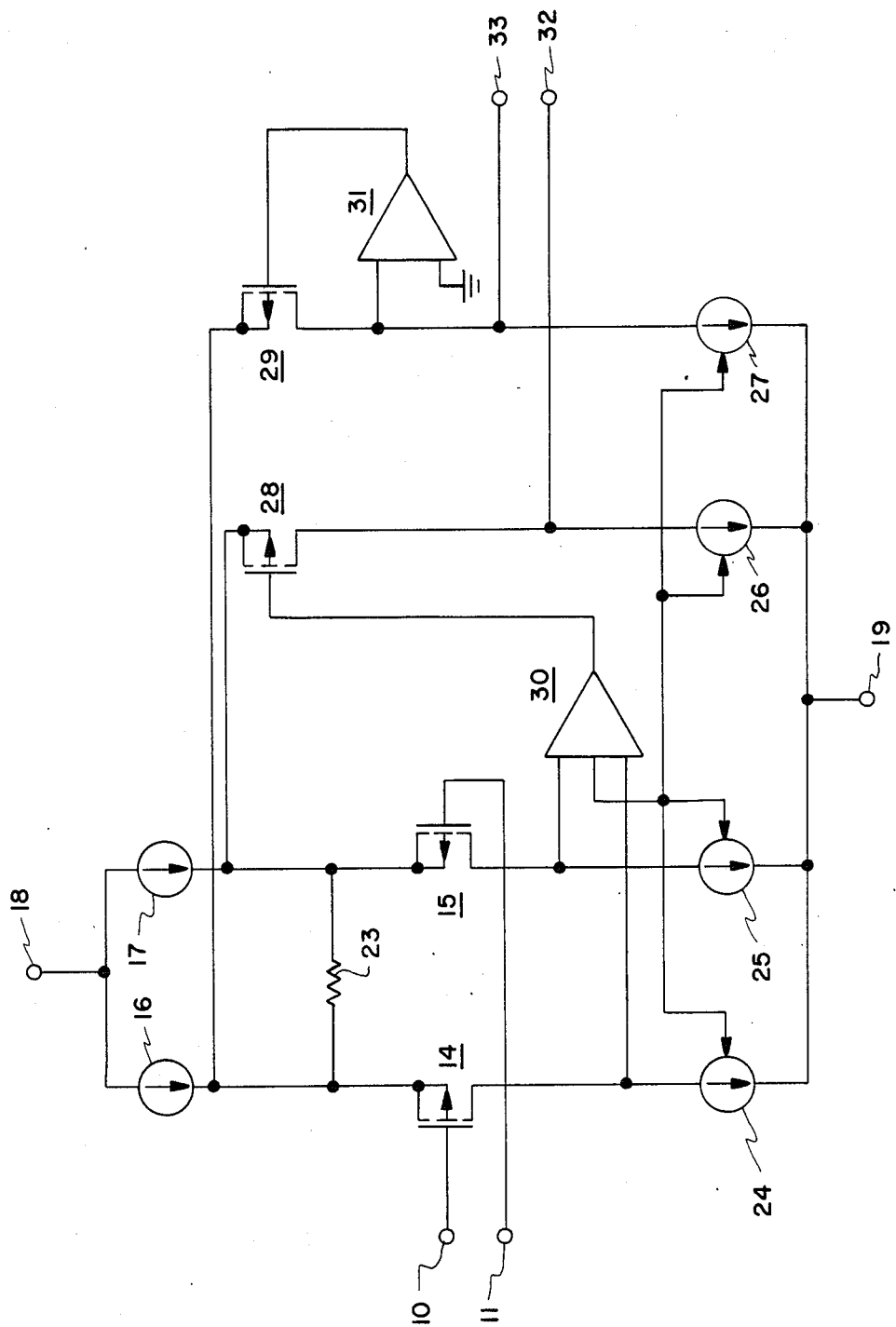
FIG. 7 shows an alternative embodiment of the invention.

The direct connections described immediately above are shown in FIG. 7.

To be certain that the current supplied by current sources 16 and 17 is just taken up by controlled current sources 24, 25, 26 and 27, a control signal is applied to each of them based on a common mode voltage signal developed in operational amplifier 30. This signal is derived from voltages applied to the inverting and non-inverting input regions of operational amplifier 30 through the voltage drops occurring across current sources 24 and 25.

In the situation of too much current being supplied from current sources 16 and 17 for current sources 24, 25, 26 and 27 to take up, an increased voltage drop will occur across both current sources 24 and 25. Since the arithmetical average of the voltage drops across these two currents sources is taken as the common mode voltage supplied to operational amplifier 30, the increase in these voltages will mean an increase in the value of their average and so in the common mode voltage experienced at the inputs of operational amplifier 30. This common mode voltage increase leads to an increase in the common mode voltage signal from operational amplifier 30 controlling current sources 24, 25, 26 and 27 thereby increasing their current values to enable them to take up the greater currents being supplied by sources 16 and 17.

Similarly, too little current supplied from current sources 16 and 17 leads to a drop in voltage across current sources 24 and 25. This drop is reflected in a reduced common mode signal from operational amplifier 30 thereby reducing the current values of current sources 24, 25, 26 and 27.

Figure 2:
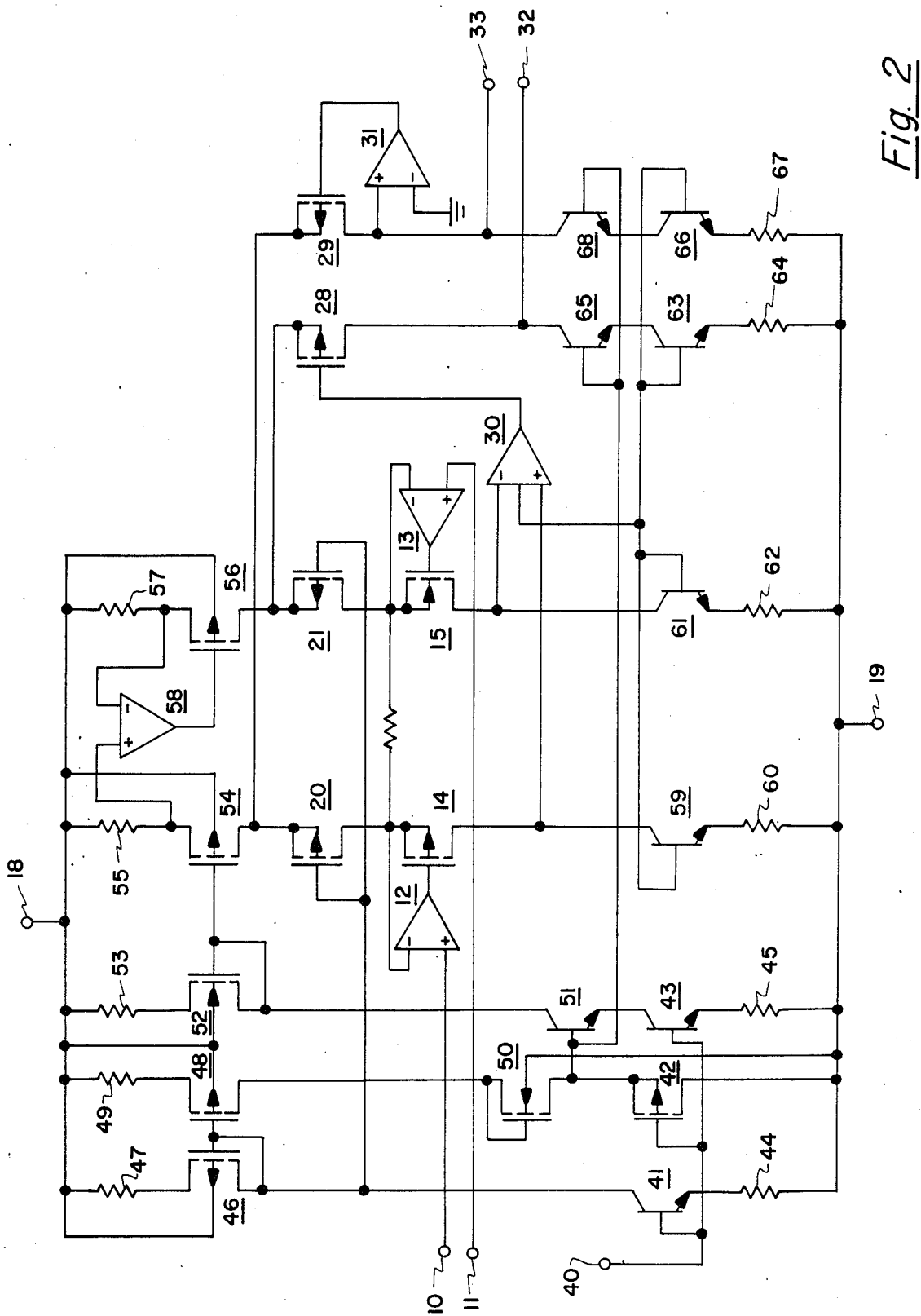
FIG. 2 shows a more complete schematic diagram of the circuit of the present invention.

An implementation of the system shown in FIG. 1 formed to meet goals of high accuracy and suitability for integration in monolithic integrated circuit chips is shown by the circuit schematic diagram of FIG. 2. Circuit components having a similar function in FIG. 2 as they had in FIG. 1 retain the same designations used in FIG. 1. The circuit schematic diagrams for the operational amplifiers used in FIG. 2 are not shown in FIG. 2 but such diagrams are shown in the following figures.

The additional circuitry on the left hand side of the diagram in FIG. 2 is used to generate bias voltages. An externally supplied bias voltage, obtained as a voltage from an external current mirror circuit using as a reference an external current, both very accurate and very constant over operating conditions, is applied to a terminal means, 40. This voltage is nominally around 1.7 volts with respect to the voltage on terminal means 19.

This voltage is thereby applied at the base of an npn bipolar transistor, 41, at the gate of a p-channel MOSFET, 42, and at the base of another npn bipolar transistor, 43. Both of these bipolar transistors typically have an emitter area four times the minimum. Transistor 42 has a typical width-to-length ratio of 100/5.

The application of this bias voltage to the base of transistor 41 leads to this voltage appearing across the base to emitter of transistor 41 and across the resistor, 44, in the emitter circuit of that transistor. This condition sets the current to be drawn by the collector of transistor 41 to being a fixed fraction of the external reference current. A similar circumstance occurs in connection with transistor 43 and the resistor in its emitter circuit, 45. A typical value for each of resistors 44 and 45 would be 20 kΩ.

Supplying this current to the collector of transistor 41 is a p-channel MOSFET, 46, and a resistor, 47, in the source circuit of transistor 46. A typical width-to-length ratio for transistor 46 is 40/10.

Since transistor 41 demands a specific current, there is correspondingly a specific voltage drop across resistor 47 and a specific voltage between the gate and source of transistor 46 sufficient to have the current demanded by transistor 41 supplied at the drain of transistor 46. This voltage drop is supplied as a gate bias voltage to transistors 20 and 21 in FIG. 2, a bias voltage which was shown supplied to terminal means 22 in FIG. 1.

Note that any changes in the power supply voltage on terminal means 18 do not lead to any significant change in the voltage difference occurring between terminal means 18 and this bias voltage occurring at the drain of transistor 46. As a result, the voltage drop across the circuit portions in FIG. 2 which are serving as current sources 16 and 17 of FIG. 1 will remain quite constant to thereby help maintain the currents from these sources also quite constant.

This bias voltage formed at the drain of transistor 46, and at the gate thereof, is also applied to the gate of another p-channel MOSFET, 48, also having a resistor, 49, in the source circuit thereof. Transistor 48 is constructed to closely match transistor 46 and resistor 49 is constructed to closely match resistor 47. As a result, the current supplied at the drain of transistor 48 is just that supplied at the drain of transistor 46. This current supplied at the drain of transistor 48 flows through an n-channel MOSFET, 50, and then through transistor 42. Transistor 50, having a typical width-to-length ratio of 5/20, merely takes up some of the voltage drop which otherwise would be across transistor 48.

Transistor 42, having a specific current supplied to it, reacts in adjusting so that the voltage from its gate to source is sufficient to result in transistor 42 passing such current. This provides a well defined voltage at the source of transistor 42 since the gate of transistor 42 is connected to the bias voltage supplied to terminal means 40. This voltage at the source of transistor 42 is then used to provide the base voltages for several bipolar transistors being used in cascode connections for achieving impedance increases.

The first of these is an npn transistor, 51, having its emitter connected to the collector of transistor 43. As a result of this arrangement, the base of transistor 51 has a voltage on it greater than the voltage on the base of transistor 43 by an amount equal to the gate-to-source voltage on transistor 42. Transistor 51 has a typical emitter area which is the minimum.

Since transistor 43 and resistor 45 determine a specific current to be drawn by transistors 43 and 51, this current must be supplied by a p-channel MOSFET, 52, having its drain connected to the collector of transistor 51. This current also passes through a resistor, 53, in the source circuit of transistor 52. Resistor 53 is constructed to closely match resistors 47 and 49 but transistor 52 is constructed to have a much larger channel width-to-length ratio, typically 500/6, than have transistors 46 and 48.

As a result, the specific current to be supplied by transistor 52 to transistor 51 can be supplied with a smaller gate to source voltage on transistor 52 than occurs between the gates and sources of transistors 46 and 48. Hence, the voltage at the gate and drain of transistor 52 has a greater value with respect to ground than does the voltage at the gate and drain of transistor 46 and at the gates of transistors 20 and 21. A typical value for each of resistors 47, 49 and 53 is 26 kΩ.

The voltage occurring at the drain and gate of transistor 52 is supplied as a bias voltage to another p-channel MOSFET, 54. Note that this voltage again retains being a constant difference from the voltage occurring on terminal means 18 even though the voltage on terminal means 18 may vary. Transistor 54 has a typical width-to-length ratio of 2000/6.

Transistor 54 is used along with a resistor in its source circuit, 55, to provide in FIG. 2 current source 16 of FIG. 1. The constant bias voltage applied to the gate of transistor 54 by the gate and drain of transistor 52 and the accurate value of resistance for resistor 55 leads to a current source of a very constant current value in view of the constant difference in voltage between terminal means 18 and the gate of transistor 54. Resistor 55 is trimmed in resistance value after construction of the integrated circuit containing it to insure an accurate value for the current being supplied at the drain of transistor 54. A typical resistance value for resistor 55 would be 6.5 kΩ.

Two measures are taken to ensure that the circuitry in FIG. 2 serving as current source 17 of FIG. 1 provides a current closely matched to that supplied at the drain of transistor 54 in FIG. 2. A p-channel MOSFET, 56, is used which is constructed to closely match transistor 54, and a resistor in its source circuit, 57, is constructed to closely match transistor 55. Further, resistor 57 is also trimmed after construction of the integrated circuit to accurately set its resistance value for setting the current. The second measure is the use of an operational amplifier, 58, to sense any difference in voltage drop across resistors 55 and 57 and to use any difference sensed to drive the gate of transistor 56 to change the current through transistor 57 just enough to essentially eliminate any voltage differences from the voltages across resistors 55 and 57.

Operational amplifier 58 must be designed to have a very low offset voltage and bias current at its input if the amplifier is to successfully force a close match in voltage drop across resistors 55 and 57. Many operational amplifier designs could be used for this purpose, including commercially available operational amplifiers if such operational amplifier was not to be formed in the monolithic integrated circuit chip with the remaining portions of FIG. 2.

Figure 3:
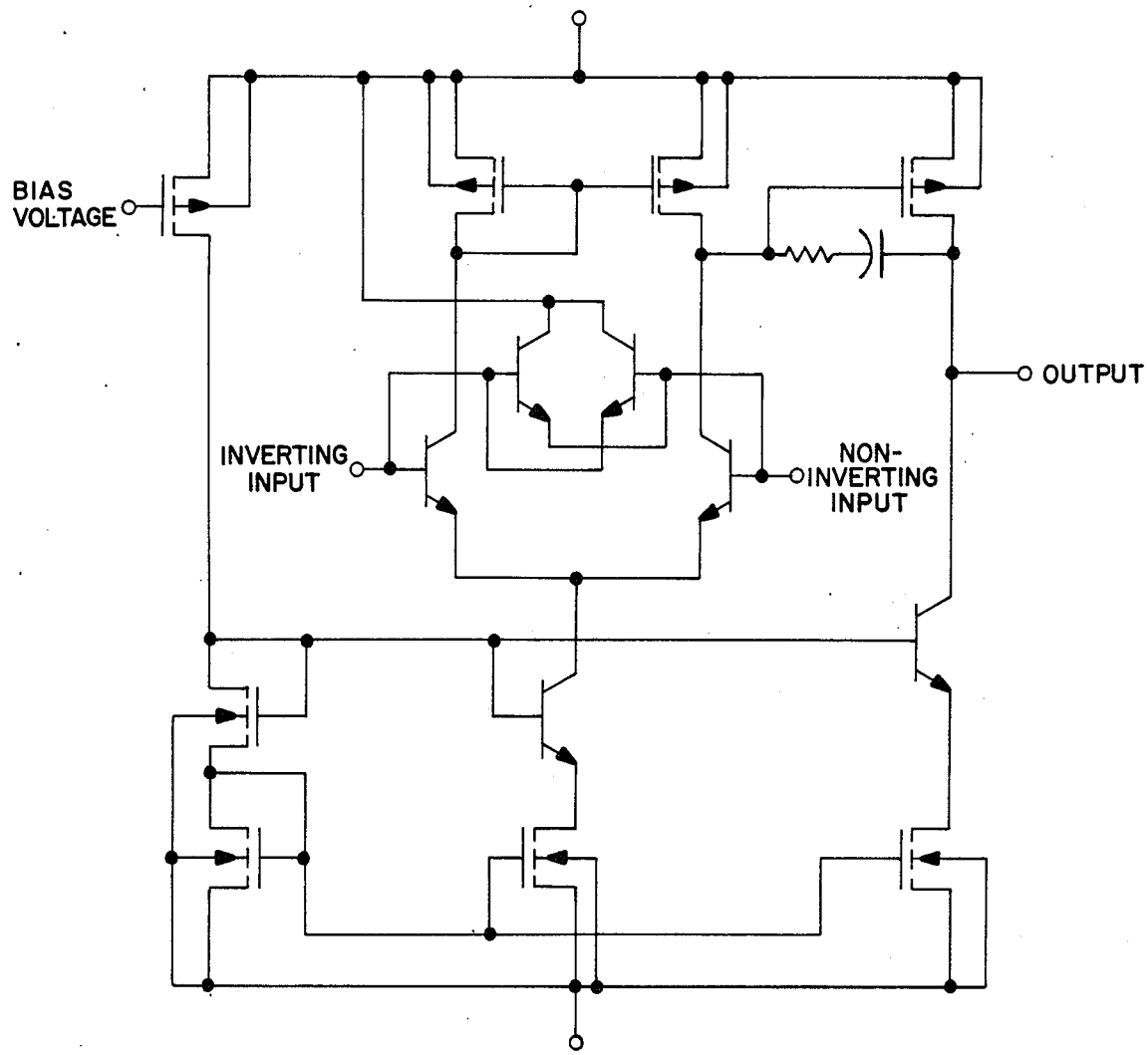
FIGS. 3, 4, 5 and 6 show schematic diagrams of operational amplifiers used in the present invention.

A schematic diagram of an amplifier suitable for integration with the remaining portions of the circuit of FIG. 2 is shown in FIG. 3. This amplifier has two stages, an input stage where the inverting and non-inverting inputs occur and an output stage where the output is taken. The input stage bipolar transistors, the bases of which serve as the inverting and non-inverting inputs, are very well matched and the first stage draws a low current to achieve a low input offset voltage and a low input bias current. A series resistor and capacitor are used between the output stage and the input stage as a compensation means to provide stability. Typical values for them would be 7.5 kΩ and 10.0 pf, respectively.

Matching of the input stage bipolar transistors is furthered by the use of a multiple, paralleled, transistor placement technique, a "cross coupling" technique. That is, each transistor is formed as two transistors electrically connected in parallel. In the geometrical placement arrangement in the monolithic integrated circuit, one of a pair of parallel transistors for one input is placed at each end of a diagonal in a square while the parallel transistors for the other input transistor are placed in the opposite ends of the other diagonal and closely adjacent to the first set of paralleled transistors. Thereby, process variances and temperature variances are spatially averaged over all these transistors to more fully achieve matching. Similarly, the p-channel load transistors are "cross coupled."

Each of the voltage controlled current sources 24, 25, 26 and 27 of FIG. 1 are formed in FIG. 2 by an npn bipolar transistor, each being of about four times the minimum emitter area, but matched, and having an emitter resistor in its circuit. The last two of these sources each has a further cascode-connected npn bipolar transistor in its collector circuit, this transistor typically having an emitter area two times the minimum. Thus, current source 24 of FIG. 1 is formed in FIG. 2 by a transistor, 59, and a resistor, 60. Current source 25 of FIG. 1 is formed by a transistor, 61, and a resistor, 62, in FIG. 2. Transistors 59 and 61 are "cross-coupled."

Current source 26 of FIG. 1 is formed by a transistor, 63, and a resistor, 64, in FIG. 2. As indicated, there is a further npn bipolar transistor, 65, also used in this current source in a cascode connection having its emitter connected to the collector of transistor 63. Again, this arrangement increases the circuit impedance seen at the collector of transistor 65.

Finally, current source 27 of FIG. 1 is formed in FIG. 2 of a transistor, 66, with a resistor, 67, in its emitter circuit in FIG. 2. Transistors 63 and 66 are "cross-coupled."

Again, for this last current source a further npn bipolar transistor, 68, is used in a cascode connection having the emitter thereof connected to the collector of transistor 66 to increase circuit impedance at the collector of transistor 68. Both transistors 65 and transistor 68 have their bases supplied at the source of transistor 42 in the same manner as does transistor 51. Resistors 60, 62, 64 and 67 are all constructed to be closely matched and of the same resistance value which typically would be 10 kΩ.

Figure 4:
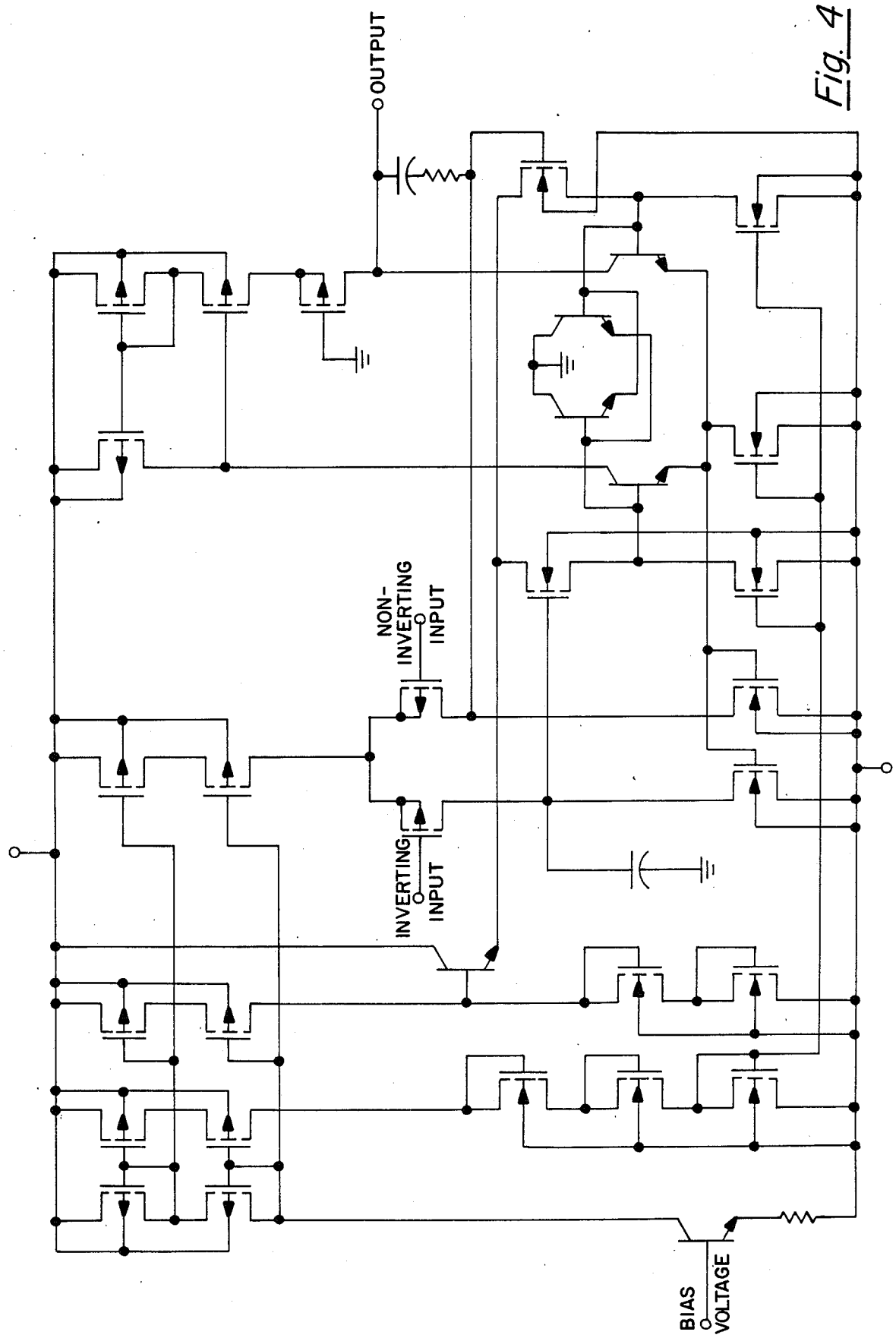

Operational amplifiers 12 and 13 are directly connected to input regions 10 and 11 in FIG. 2. Because of this, the circuit used for these operational amplifiers must have a high common mode rejection ratio and a high power supply rejection ratio while at the same time having a low input bias current and low input offset voltage to avoid degradation due to, or distortion of, the system input signals. This is achieved in the circuit shown in FIG. 4 by using a matched and "cross-coupled" pair of p-channel MOSFETs at the inputs to eliminate any input bias current offset and to keep the offset voltage small. This is further achieved by having the second stage of the amplifier also a differential amplifier with capacitances at each of the two second stage inputs coupled to ground and the output, respectively, and not the power supplies. This gives a good power supply rejection ratio. Again, one of these capacitors and a series resistor are used between the output and the second stage input to provide compensation to stabilize the amplifier circuit. A typical value for both capacitances is 10 pf, and for the resistor a typical value is 1 kΩ.

Figure 5:
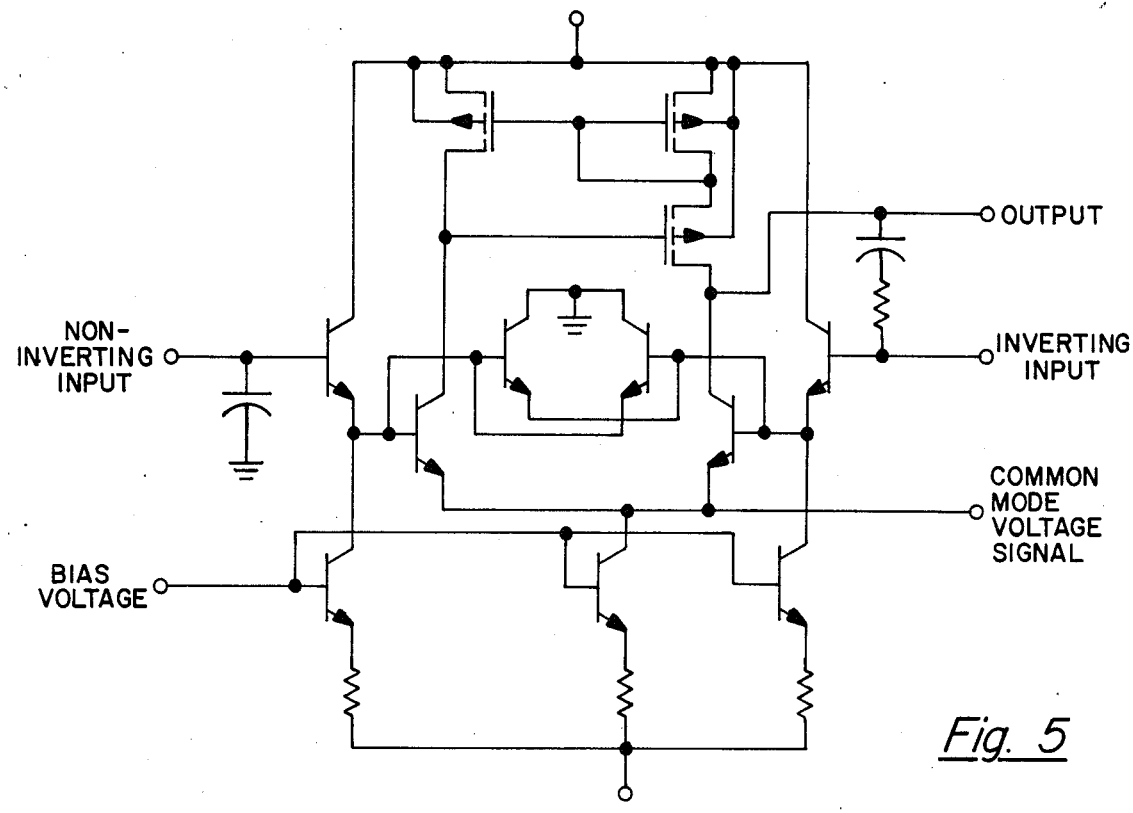

Operational amplifier 30 provides the gain in the major feedback loop used in the circuits of FIGS. 1 and 2. This operational amplifier must have a high transconductance to provide stability in this feedback loop and to assure linear operation. There must also be low offset in the input bias currents to avoid disturbing the current balance in the system first stage. The circuit shown for this operational amplifier in FIG. 5 achieves these goals through use of high gain bipolar transistor differential amplifier stage. In that stage the emitters of the input npn bipolar transistors directly drive the bases of second set of differential npn bipolar transistors to give a very high gain reminiscent of Darlington circuit connections.

A series resistor and capacitor between the output and the inverting input again provides amplifier stability. Typical values are 1 kΩ and 30 pf, respectively. There is also a capacitance of 30 pf from the non-inverting input to ground. The common mode voltage signal can be seen to be taken from the circuit node where the emitters of the second set of bipolar transistors are joined to the current source drawing current from them. Since this node is two base-emitter diodes from each of the inputs, this node will reflect the average voltage occurring at the inputs.

Figure 6:
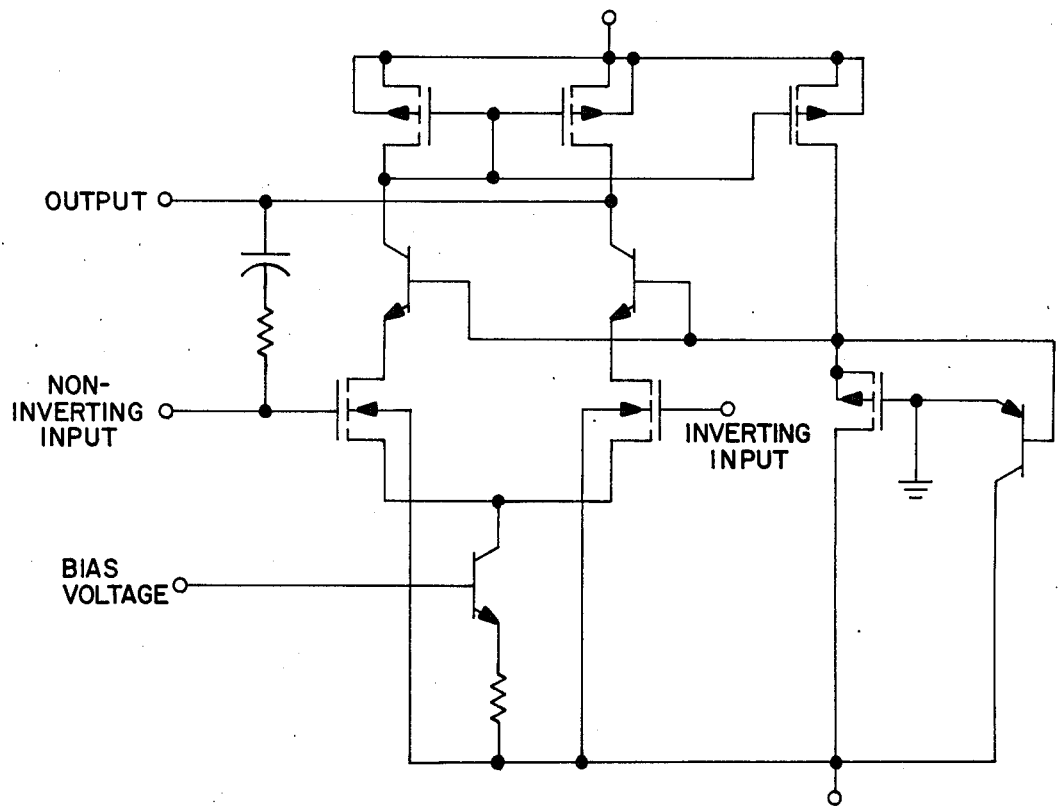

Finally, operational amplifier 31 has moderate performance requirements. This follows since the reference voltage at which the non-inverting input of transistor 29 is operated is a matter of choice so that offsets at the input of this amplifier are not critical. The amplifier should be stable and have sufficient gain to be able to hold the voltage on the non-inverting input to approximately that to which the inverting input is connected. The circuit shown in FIG. 6 is sufficient for this purpose. Again, there is included a series resistor and capacitor between the output and the inverting input to provide compensation for stability. A typical value of capacitance is 10 pf, and a typical value of resistance is 5 kΩ.

The embodiments of the invention in which an exclusive property or right is claimed are defined as follows:

1. A differential voltage to current converter having a first and second input regions and having a first and second output regions, said converter comprising:

first, second, third, fourth, fifth and sixth effective current sources each having first and second terminating regions through which each provides a selected current flow, said first current source first terminating region and said second current source first terminating region each being electrically connected to a first terminal means adapted for electrical connection to a first voltage source, said fifth current source first terminating region being electrically connected to said first output region, said sixth current source first terminating region being electrically connected to said second output region, and each of said second terminating regions of each of said third, fourth, fifth and sixth current sources being electrically connected to a second terminal means adapted for electrical connection to a second voltage source;

first, second, third and fourth current pass means each having first and second terminating regions between which a conductive path is effectively provided of a selected conductivity, said first current pass means first terminating region being electrically connected to said first current source second terminating region, said second current pass means first terminating region being electrically connected to said second current source second terminating region, said third current pass means first terminating region being electrically connected to said second current source second terminating region, said third current pass means second terminating region being electrically connected to said fifth current source first terminating region, said fourth current pass means first terminating region being electrically connected to said first current source second terminating region, and said fourth current pass means second terminating region being electrically connected to said sixth current source first terminating region;

first and second voltage setting means each having first and second terminating regions and each having a control region therein by which it is capable of being directed to effectively provide a conductive path of a selected conductivity between its first and second terminating regions, said first voltage setting means control region being electrically connected to said first input region, said first voltage setting means first terminating region being electrically connected to said first current pass means second terminating region, said first voltage setting means second terminating region being electrically connected to said third current source first terminating region, said second voltage setting means control region being electrically connected to said second input region, said second voltage setting means first terminating region being electrically connected to said second current pass means second terminating region, and said second voltage setting means second terminating region being electrically connected to said fourth current source first terminating region; and a first current setting means having first and second terminating regions, between which a conductive path is effectively provided of a selected conductivity, said first current setting means first terminating region being electrically connected to said first voltage setting means first terminating region and said first current setting means second terminating region being electrically connected to said second voltage setting means first terminating region.

2. The apparatus of claim 1 wherein said first current pass means is formed by a direct interconnection, and said second current pass means is formed by a direct interconnection.

3. The apparatus of claim 1 wherein said first current pass means also has a control region therein by which said first current pass means is capable of being directed to effectively provide a selected conductivity in said conductive path between said first current pass means first and second terminating regions, and wherein said second current pass means also has a control region therein by which said second current pass means is capable of being directed to effectively provide a selected conductivity in said conductive path between said second current pass means first and second terminating regions, said first and second current pass means control regions each being electrically connected to a third terminal means adapted for electrical connection to a third voltage source.

4. The apparatus of claim 3 wherein said first and second current pass means each consist of a field-effect transistor.

5. The apparatus of claim 1 wherein said fourth current pass means also has a control region therein by which said fourth current pass means is capable of being directed to effectively provide a selected conductivity in said conductive path between said fourth current pass means first and second terminating regions, said fourth current pass means control region being electrically connected to said sixth current source first terminating region.

6. The apparatus of claim 5 wherein said fourth current pass means comprises a transistor, said transistor having first and second terminating regions and having a control region therein by which it is capable of being directed to effectively provide a conductive path of a selected conductivity between said transistor first and second terminating regions, said transistor first terminating region serving as said first terminating region for said fourth current pass means, and said transistor second terminating region serving as said second terminating region for said fourth current pass means.

7. The apparatus of claim 6 wherein said fourth current setting means further comprises an operational amplifier with said transistor, said operational amplifier having a first input region which is capable of a relatively high circuit impedance, a second input region which is capable of a relatively high circuit impedance, and an output region, said operational amplifier being capable of providing a large magnitude gain in an opposite magnitude direction for signals appearing at said operational amplifier output region over corresponding signals appearing at said operational amplifier first input region, said operational amplifier being capable of providing a large magnitude gain in an identical magnitude direction for signals appearing at said operational amplifier output region over corresponding signals appearing at said operational amplifier second input region, said transistor control region being electrically connected to said operational amplifier output region, said operational amplifier first input region serving as said control region, and said operational amplifier being electrically connected to a third terminal means adapted for electrical connection to a third voltage source.

8. The apparatus of claim 1 wherein said first voltage setting means comprises a first voltage setting transistor, and said second voltage setting means comprises a second voltage setting transistor, said first and second voltage setting transistors each having first and second terminating regions and having a control region therein by which it is capable of being directed to effectively provide a conductive path of a selected conductivity between its said first and second terminating regions, said first and second voltage setting transistor first terminating regions serving as said first and second voltage setting means first terminating regions, respectively, and said first and second voltage setting transistor second terminating regions serving as said first and second voltage setting means second terminating regions, respectively.

9. The apparatus of claim 8 wherein each of said first and second voltage setting transistors consist of a field-effect transistor.

10. The apparatus of claim 9 wherein each of said first and second voltage setting transistors has a gate region as said first and second voltage setting transistor control region which serves as said first and second voltage setting means control regions, respectively.

11. The apparatus of claim 8 wherein said first voltage setting means further comprises a first voltage setting operational amplifier with said first voltage setting transistor and said second voltage setting means further comprises a second voltage setting operational amplifier with said second voltage setting transistor, said first and second voltage setting operational amplifiers each having a first input region which is capable of a relatively high circuit impedance, a second input region which is capable of a relatively high circuit impedance, and an output region, said first and second voltage setting operational amplifiers each being capable of providing a large magnitude gain in an opposite magnitude direction for signals appearing at its said output region over corresponding signals appearing at its said first input region and each being capable of providing a large magnitude gain in an identical magnitude direction for signals appearing at its said output region over corresponding signals appearing at its said second input region, said first and second voltage setting transistor first terminating regions being electrically connected to said first and second voltage setting operational amplifier first input regions, respectively, said first and second voltage setting transistor control regions being electrically connected to said first and second voltage setting operational amplifier output regions, respectively, and said first and second voltage setting operational amplifier second input regions serving as said first and second voltage setting means control regions, respectively.

12. The apparatus of claim 1 wherein said third, fourth, fifth and sixth current sources are each voltage controlled current sources each having a control region therein at which a voltage can be applied to select a current flow between said first and second terminating regions of each, and which apparatus further comprises a common mode voltage sensing means having an input region and an output region where said output region is capable of providing a signal representative of voltage sensed on said input region, said common mode voltage sensing means input region being electrically connected to said fourth current source first terminating region, said common mode voltage sensing means output region being electrically connected to each of said control regions of said third, fourth, fifth and sixth current sources.

13. The apparatus of claim 1 wherein said third current pass means also has a control region therein by which said third current pass means is capable of being directed to effectively provide a selected conductivity in said conductive path between said third current pass means first and second terminating regions, said third current pass means control region being electrically connected to said fourth current source first terminating region.

14. The apparatus of claim 13 wherein said third current pass means comprises a transistor, said transistor having first and second terminating regions and having a control region therein by which it is capable of being directed to effectively provide a conductive path of a selected conductivity between said transistor first and second terminating regions, said transistor first terminating region serving as said first terminating region for said third current pass means, and said transistor second terminating region serving as said second terminating region for said third current pass means.

15. The apparatus of claim 14 wherein said third current pass means further comprises an operational amplifier with said transistor, said operational amplifier having a first input region which is capable of a relatively high circuit impedance, a second input region which is capable of a relatively high circuit impedance, and an output region, said operational amplifier being capable of providing a large magnitude gain in an opposite magnitude direction for signals appearing at said operational amplifier output region over corresponding signals appearing at said operational amplifier first input region, said operational amplifier being capable of providing a large magnitude gain in an identical magnitude direction for signals appearing at said operational amplifier output region over corresponding signals appearing at said operational amplifier second input region, said transistor control region being electrically connected to said operational amplifier output region, said operational amplifier first input region serving as said third current pass means control region, and said operational amplifier second input region being electrically connected to said third current source first terminating region.

16. The apparatus of claim 15 wherein said third, fourth, fifth and sixth current sources are each voltage controlled current sources each having a control region therein at which a voltage can be applied to select a current flow between said first and second terminating regions of each, and wherein said operational amplifier has a common mode voltage signal output region capable of providing a signal representative of an average of values of any voltages simultaneously occurring on both of said operational amplifier first and second inputs, said operational amplifier common mode voltage signal output region being electrically connected to each of said control regions of said third, fourth, fifth and sixth current sources.

17. The apparatus of claim 15 wherein said first current pass means is formed by a direct interconnection, and said second current pass means is formed by a direct interconnection.

18. The apparatus of claim 15 wherein said first current pass means also has a control region therein by which said first current pass means is capable of being directed to effectively provide a selected conductivity in said conductive path between said first current pass means first and second terminating regions, and said second current pass means also has a control region therein by which said second current pass means is capable of being directed to effectively provide a selected conductivity in said conductive path between said second current pass means first and second terminating regions, said first and second current pass means control regions each being electrically connected to a third terminal means adapted for electrical connection to a third voltage source.

19. The apparatus of claim 15 wherein said fourth current pass means has a control region therein by which said fourth current pass means is capable of being directed to effectively provide a selected conductivity in said conductive path between said fourth current pass means first and second terminating regions, said fourth current pass means control region being electrically connected to said sixth current source first terminating region.

20. The apparatus of claim 16 wherein said first current pass means is formed by a direct interconnection, and said second current pass means is formed by a direct interconnection.

21. The apparatus of claim 16 wherein said first current pass means also has a control region therein by which said first current pass means is capable of being directed to effectively provide a selected conductivity in said conductive path between said first current pass means first and second terminating regions, and said second current pass means also has a control region therein by which said second current pass means is capable of being directed to effectively provide a selected conductivity in said conductive path between said second current pass means first and second terminating regions, said first and second current pass means control regions each being electrically connected to a third terminal means adapted for electrical connection to a third voltage source.

22. The apparatus of claim 16 wherein said fourth current pass means has a control region therein by which said fourth current pass means is capable of being directed to effectively provide a selected conductivity in said conductive path between said fourth current pass means first and second terminating regions, said fourth current pass means control region being electrically connected to said sixth current source first terminating region.

* * * * *